United States Patent [19]
Takata et al.

[11] Patent Number: 5,977,613
[45] Date of Patent: Nov. 2, 1999

[54] ELECTRONIC COMPONENT, METHOD FOR MAKING THE SAME, AND LEAD FRAME AND MOLD ASSEMBLY FOR USE THEREIN

[75] Inventors: Hirofumi Takata; Tadashi Tanida, both of Okayama, Japan

[73] Assignee: Matsushita Electronics Corporation, Osaka, Japan

[21] Appl. No.: 08/811,606

[22] Filed: Mar. 4, 1997

[30] Foreign Application Priority Data

Mar. 7, 1996 [JP] Japan ..................... 8-049965

[51] Int. Cl.⁶ ........................ H01L 23/495
[52] U.S. Cl. .............. 257/666; 257/676; 257/787
[58] Field of Search ................ 257/692, 666, 257/787, 676

[56] References Cited

U.S. PATENT DOCUMENTS 5,172,214  12/1992  Casto ........................ 257/676
5,521,429  5/1996   Aono et al. ................. 257/676

FOREIGN PATENT DOCUMENTS 58-122457  8/1983   Japan .
61-128548  6/1986   Japan .
62-112333  5/1987   Japan .
6-132453   5/1994   Japan .

Primary Examiner—Teresa M. Arroyo
Assistant Examiner—Roy Potter
Attorney, Agent, or Firm—McDermott, Will & Emery

[57] ABSTRACT

A lead has a thick part having a thickness of 0.2 mm and a thin part having a thickness of 0.1 mm. The thin part is formed having a greater width than the thick part for preventing the lead from slipping from a resin. A semiconductor chip is fixed on the thin part using a conductive adhesive. A lateral surface of the thick part and a lateral surface of the resin are simultaneously formed by a single cut so that the thick part's lateral surface is located at a lower end area of the resin's lateral surface and these surfaces are exposed forming the same plane. A bottom surface of the thick part projects by from 0.03 mm to 0.05 mm from the resin bottom surface to meet lead stand-off specifications. Thick parts of other leads electrically connected with electrodes on the semiconductor chip with Au wires, are likewise exposed at the resin lateral surface and project from the resin bottom surface. Such arrangements realize high density mounting of electronic components onto a printed board.

29 Claims, 18 Drawing Sheets

ELECTRONIC COMPONENT, METHOD FOR MAKING THE SAME, AND LEAD FRAME AND MOLD ASSEMBLY FOR USE THEREIN

BACKGROUND OF THE INVENTION

The present invention relates generally to electronic components of resin molded package type, and, more particularly, to electronic components suitable for surface mount technology.

Electronic components of the surface mount type are well known. FIG. 22 shows an external view of a conventional electronic component of the surface mount type which incorporates therein a semiconductor chip (an electronic element). Electronic component 70, shown in FIG. 22, has elongated, first to third leads 71–73. 74 is a resin having the form of a rectangular parallelepiped which encapsulates a semiconductor chip. Each lead 71–73 horizontally stretches out from opposite lateral surfaces of resin 74 and has an L-shaped bent. The bottom dimensions of resin 74 is 1.6 mm×0.8 mm, and each lead 71–73 projects from resin 74 for from 0.4 mm to 0.6 mm. To prevent poor soldering (i.e., defective soldering in which, when mounting electronic component 70 onto a printed board, a good bond is not produced at a junction between the printed board and each lead 71–73), it is required by lead stand-off specifications that the bottom surface of resin 74 floats 0 mm to 0.1 mm on the printed board surface.

FIG. 23 is a plan view of a conventional lead frame for use in the fabrication of electronic component 70. Lead frame 80 of FIG. 23 is formed of a rectangular metal plate that has a uniform thickness and comprises lead formation part 81 and exterior frame 82 for enclosing lead formation part 81. Bridge part 83 is provided which acts as a bridge to connect together opposite sides of exterior frame 82, and a plurality of sets of lead parts 71–73 extend from the opposite sides of exterior frame 82. These lead parts 71–73 are one-dimensionally placed at pitches ranging from 3.0 mm to 4.0 mm, running in the lengthwise direction of lead frame 80.

The fabrication of electronic component 70, that is, the assembly process thereof, comprises a die bonding process, a wire bonding process, a molding process, a deburring process, a lead finishing process, a trimming process, and a forming process. In the die bonding process, semiconductor chips are fixed on the corresponding leading ends of first lead parts 71 of lead frame 80 of FIG. 23 using a conductive adhesive. In the wire bonding process, two electrodes on each semiconductor chip are electrically connected with the leading ends of second and third lead parts 72 and 73 by fine wires of Au (gold). In the molding process, a mold assembly for transfer mold is used for integral encapsulation of the individual semiconductor chips, the Au wires, the leading ends of lead parts 71–73 with resin 74. In this molding process, a plurality of cavities, defined between an upper mold element and a lower mold element, are one-dimensionally arranged, running in the lengthwise direction of lead frame 80 and being isolated from one another. In other words, a resin is injected, from a common runner through respective gates, into each cavity. FIG. 24 shows lead frame 80 that has undergone a molding process. In the deburring process, burrs, formed by resin escaped from fine gaps defined between the mold assembly and the lead frame 80 onto lead parts 71–73, are removed. In the lead finishing process, lead parts 71–73 extending from each resin 74 are solderplated. Deburring is an indispensable process to smooth solderplating. In the trimming process, lead parts 71–73 are cut such that individual electronic components 70 are separated. In the forming process, bending is performed so that each lead part 71–73 has a bent, as shown in FIG. 22.

The above-described conventional electronic component 70 has elongated leads 71–73 which project from lateral surfaces of resin 74. Therefore, electronic component 70 occupies a considerably larger space in comparison with a semiconductor chip (an electronic element), therefore producing the problem that mounting density on a printed board cannot be increased much. Additionally, leads 71–73 which project from resin 74 are vulnerable, which may result in an unexpected change in the lead form at the time of mounting an electronic component 70 onto a printed board, thereby causing defective soldering.

The above-described fabrication method of electronic component 70 requires both a deburring process and a forming process. It is preferred that deburring is eliminated, since the deburring process produces no additional values to products. In the forming process, unexpected lead deformation and the cut of a lead may occur. Further, in the forming process, there are difficulties in always conforming to lead stand-off specifications and there has been the problem that yields tend to drop.

In the above-described lead frame 80, a plurality of sets of lead parts 71–73 are one-dimensionally arranged at a great pitch, therefore producing the problem that the number of electronic components 70 that a single lead frame 80 can yield is small. Metal material for forming lead frame 80 is used inefficiently.

In the above-described conventional mold assembly, a plurality of cavities, which are one-dimensionally arranged at a great pitch corresponding to lead frame 80, are defined between the upper mold element and the lower mold element, so that the number of electronic components 70 that a single molding process can yield is small, resulting in poor productivity.

SUMMARY OF THE INVENTION

Accordingly, it is an object of the present invention to provide an improved electronic component of a resin molded package type capable of realizing a higher mounting density on a printed board in comparison with conventional techniques and capable of suppressing lead deformation occurring at the mounting process.

Another object of the present invention is to provide a method for fabricating an electronic component of a resin molded package type capable of eliminating deburring and forming processes thereby providing a high productivity.

Still another object of the present invention is to provide an improved lead frame for use in the fabrication of electronic components of a resin molded package type so that a greater number of electronic components can be taken efficiently in comparison with conventional techniques.

Another object of the present invention is to improve the productivity of mold assembly for use in the fabrication of electronic components of a resin molded package type.

The present invention provides an electronic component of a resin molded package type. This electronic component comprises:

(a) an electronic element;
(b) a lead which is electrically connected with the electronic element; and
(c) a resin which encapsulates the electronic element and the lead;

wherein a lateral surface of the lead and a lateral surface of the resin are simultaneously formed by a single cut such that the lateral surface of the lead is located at a lower end area of the lateral surface of the resin and the lateral surfaces of the lead and the resin are exposed forming the same plane.

Accordingly, the lateral surface of the lead, formed by cutting, is exposed at the lower end area of the lateral surface of the resin. In other words, an area, taken up by an electronic component of this invention on a printed board, is equal to the bottom surface area of the resin. In accordance with the electronic component of the present invention, a higher mounting density on a printed board, as compared with conventional electronic components in which elongated leads project from resin lateral surfaces, is accomplished. Additionally, lead deformation is unlikely to occur when performing a mounting process on a printed board. If it is arranged such that the lead bottom surface slightly projects from a resin bottom surface, lead standoff specifications can be met easily.

More specifically, a lead of an electronic component of the present invention includes a thin part which is electrically connected with an electronic element and a thick part which is formed having a greater thickness than the thin part so as to provide a step on the side of the lead's bottom surface, and a lateral surface of the thick part and the lateral surface of the resin are simultaneously formed by a single cut so that the lateral surface of the thick part is located at a lower end area of the lateral surface of the resin and the lateral surfaces of the thick part and the resin are exposed forming the same plane, and a bottom surface of the thick part is exposed at a bottom surface of the resin. As a result of such arrangement, in performing a high density mounting process on a printed board, a corner part, which is defined by a lateral and a bottom surface of the thick part, is used for external connection. If it is arranged such that the bottom surface of the thick part projects, from the bottom surface of the resin, by a length less than a difference in thickness between the thin part and the thick part, lead stand-off specifications can be met easily while at the same time maintaining insulation between lead thin part and printed board. Arrangements, such as providing a wider top surface to a thin part in comparison with a thick part and forming a notch in a thin part, prevent a lead from slipping from a resin. An electronic element is fixed on a lead thin part.

The present invention provides a method for fabricating an electronic component. This method comprises:

(a) a step of fixing an electronic element on a plate-like lead frame having a lead part;

(b) a step of electrically connecting the electronic element with the lead part;

(c) a step of integrally encapsulating the electronic element and the lead part with a resin; and (d) a step of cutting the lead frame together with the resin in order that a resin cut surface and a lead cut surface are formed at the same time on a package lateral surface of the electronic component.

As a result of such arrangement, a resin cut surface and a lead cut surface are formed on a package lateral surface at the same time, therefore eliminating the need for performing a deburring process. Additionally, unlike conventional techniques, there is no need to perform a forming process in which an elongated lead is subjected to bending, therefore providing improved yields.

More specifically, in a method of efficiently fabricating a plurality of electronic components of a resin molded package type of this invention, a plate-like lead frame is employed which comprises a plurality of bridge parts which are formed into a lattice and a plurality of sets of lead parts which extend towards a plurality of lattice open spaces which are horizontally and perpendicularly, and two-dimensionally defined by the plurality of bridge parts. This fabrication method comprises the steps of:

(a) over the plate-like lead frame, a step of fixing each of a plurality of electronic elements in a corresponding lattice open space of the plurality of lattice open spaces;

(b) a step of electrically connecting each of the electronic elements with a corresponding set of lead parts of the plurality of sets of lead parts;

(c) a step of encapsulating the plurality of electronic elements and the plurality of sets of lead parts with a resin so that the plurality of electronic elements and the plurality of sets of lead parts are continuous with one another at least in one direction; and (d) a step of cutting the lead frame together with the resin such that the plurality of sets of lead parts of the lead frame are separated from the plurality of bridge parts respectively and resin cut surfaces and lead cut surfaces are formed at the same time on individual package lateral surfaces of the plurality of electronic components.

The above-described arrangement not only makes it possible to omit deburring and forming processes, but also improves productivity. In the encapsulation step, a resin is injected through common gates into a plurality of cavities which are horizontally and perpendicularly, and two-dimensionally arranged in corresponding manner to the plurality of electronic elements and which are communicated with one another at least in one direction. In the cutting step, the lead frame is cut together with the resin at a width greater than the width of the bridge part of the lead frame in order that resin cut surfaces and lead cut surfaces are formed at the same time on package lateral surfaces of two electronic components of the plurality of electronic components corresponding to two adjacent electronic elements of the plurality of electronic elements.

The present invention provides a lead frame comprising:

(a) a rectangular exterior frame;

(b) a plurality of bridge parts which are formed into a lattice so as to establish connections between a pair of opposite sides of the rectangular exterior frame as well as between another pair of opposite sides thereof; and (c) a plurality of sets of lead parts which extend towards respective lattice open spaces which are horizontally and perpendicularly, and two-dimensionally defined by the bridge parts.

Such arrangement makes it possible to two-dimensionally and closely place a great number of lead parts on a single lead frame. Accordingly, the number of electronic components that a single lead frame can yield is increased, and metal material for forming a lead frame is used efficiently.

The present invention provides a mold assembly comprising:

(a) a lower mold element onto which a lead frame with a plurality of electronic elements which are arranged horizontally and perpendicularly, and two-dimensionally is placed;

(b) an upper mold element, cooperating with the lower mold element, that defines a plurality of cavities which are horizontally and perpendicularly, and two-dimensionally arranged correspondingly to the plurality of electronic elements and which are communicated with one another at least in one direction; and (c) common gates through which a resin is injected into the plurality of cavities.

Accordingly, it is possible to closely and two-dimensionally define a plurality of cavities between the upper mold element and the lower mold element, whereby the number of electronic components that a single molding process can yield is increased and the productivity is improved. Additionally, since the plurality of cavities are communicated with one another, this allows a resin to be injected through the common gates into each cavity at high efficiency. Unnecessary portions of the cured resin are removed together with unnecessary portions of the lead frame later.

DETAILED DESCRIPTION OF THE INVENTION

Preferred embodiments of this invention are now described in detail with reference to the accompanying drawings.

Figure 1:
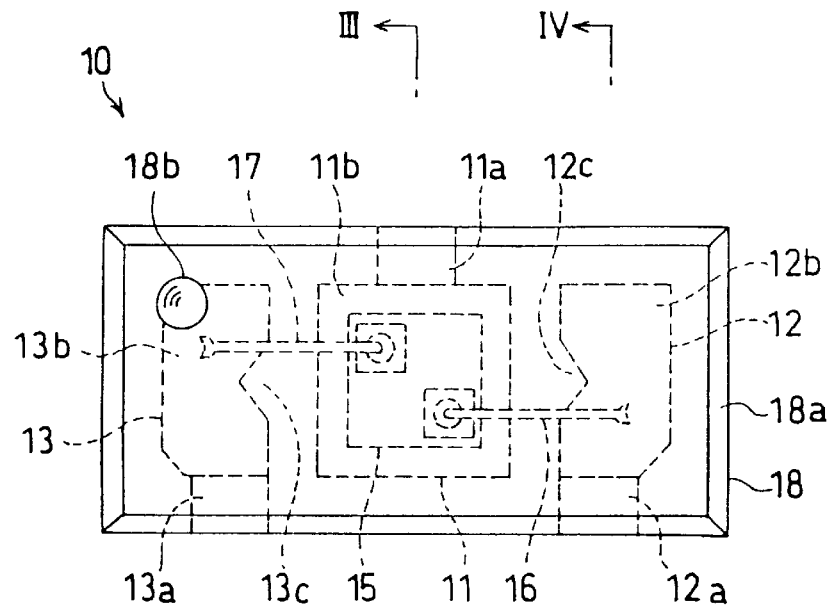
FIG. 1 is a plan view of an electronic component in accordance with the present invention.
Figure 2:
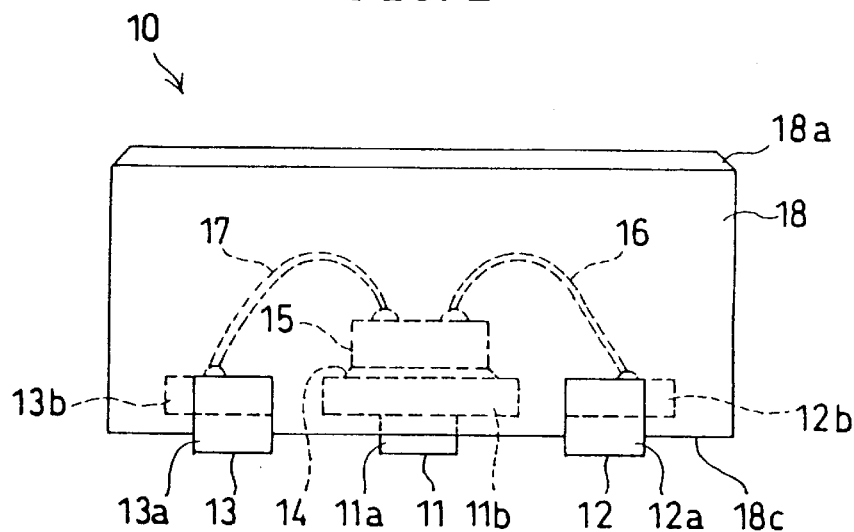
FIG. 2 is a front view of the electronic component of FIG. 1.
Figure 3:
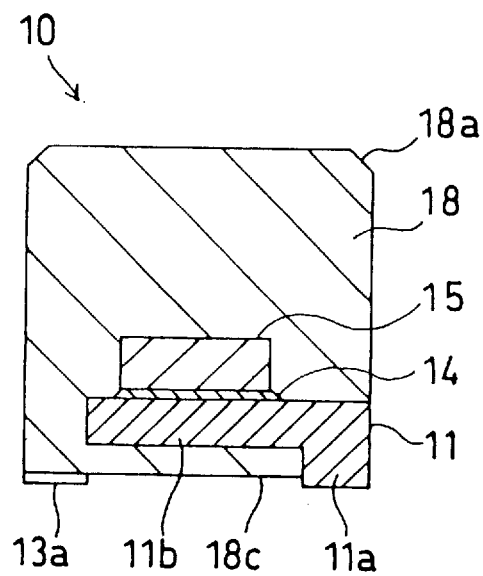
FIG. 3 is a cross sectional view of the electronic component taken along the line III—III of FIG. 1.
Figure 4:
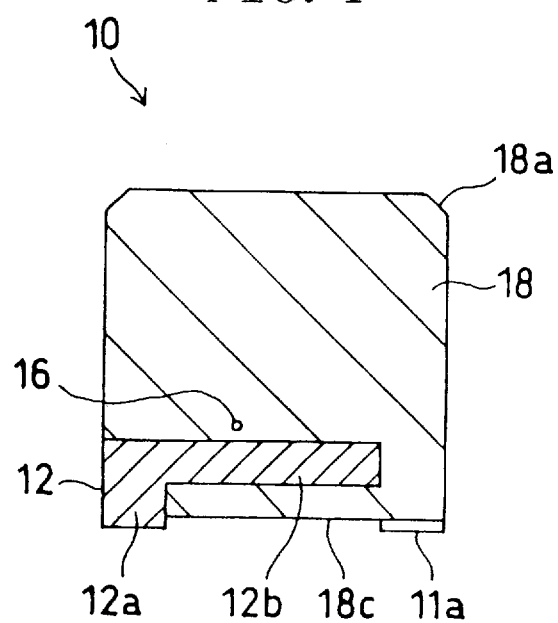
FIG. 4 is a cross sectional view of the electronic component taken along the line IV—IV of FIG. 1.

FIGS. 1–4 show the appearance and internal structure of an electronic component of a surface mount type in accordance with the present invention. FIG. 1 is a plan view of an electronic component in accordance with the present invention. FIG. 2 is a front view of the electronic component of FIG. 1. FIG. 3 is a cross sectional view of the electronic component taken along the line III—III of FIG. 1. FIG. 4 is a cross sectional view of the electronic component taken along the line IV—IV of FIG. 1. 10 is an electronic component of this invention. This electronic component 10 has a first lead 11, a second lead 12, a third lead 13, a semiconductor chip (an electronic element) 15, and a resin 18. The bottom dimensions of resin 18 having the form of a rectangular parallelepiped are 1.6 mm×0.8 mm. Each of leads 11–13 has the same length, 0.65 mm.

First lead 11 has a thick part 11a whose length, width, and thickness are 0.15 mm, 0.2 mm, and 0.2 mm and a thin part 11b whose length, width, and thickness are 0.5 mm, 0.5 mm, and 0.1 mm. A step of 0.1 mm is provided on the bottom surface side of first lead 11. First lead 11 has a flat top surface. To prevent first lead 11 from slipping from resin 18, thin part 11b has a top surface (0.5 mm×0.5 mm) which is greater in width than thick part's 11a top surface and which is great in area than semiconductor chip 15. Semiconductor chip 15 is fixed on thin part 11b using a conductive adhesive 14. As a result of such arrangement, semiconductor chip 15 is electrically connected, at its bottom surface, with first lead 11. A lateral surface (0.2 mm×0.2 mm) of thick part 11a and a lateral surface of resin 18 are formed at the same time by a single cut such that the lateral surface of thick part 11a is located at a lower end area of the lateral surface of resin 18 and the lateral surfaces of thick part 11a and resin 18 are exposed forming the same plane, in other words these lateral surfaces are flush with each other.

Second lead 12 has a thick part 12a (length: 0.15 mm; width: 0.2 mm, thickness: 0.2 mm) and a thin part 12b (length: 0.5 mm; width: 0.3 mm, thickness: 0.1 mm). Likewise, third lead 13 has a thick part 13a (length: 0.15 mm; width: 0.2 mm, thickness: 0.2 mm) and a thin part 13b (length: 0.5 mm; width: 0.3 mm, thickness: 0.1 mm). A step of 0.1 mm is provided on the bottom sides of second and third leads 12 and 13, and second and third leads 12 and 13 each have a flat top surface. To prevent second and third leads 12 and 13 from slipping from resin 18, thin parts 12b and 13b have top surfaces wider than those of thick parts 12a and 13a. Thin parts 12b and 13b are further provided with notches 12c and 13c which function as means for preventing the leads 12 and 13 from slipping from resin 18. Each notch 12c and 13c has a dimension of 0.08 mm as a depth. Lateral surfaces (0.2 mm×0.2 mm) of thick parts 12a and 13a, and another lateral surface of resin 18 are formed at the same time by a single cut such that the lateral surfaces of thick parts 12a and 13a are located at lower end areas of the lateral surface of resin 18 and the lateral surfaces of thick parts 12a and 13a and resin 18 are exposed forming the same plane, in other words these lateral surfaces are flush with each other. Two electrodes on semiconductor chip 15 are electrically connected with thin parts 12b and 13b of second and third leads 12 and 13 by Au wires 16 and 17. First to third leads 11–13 are formed of soft material that cuts easily such as FeNi alloy, Cu, and Al.

Resin 18 encapsulates most of first to third leads 11–13, semiconductor chip 15, Au wire 16, and Au wire 17. 18a is a peripheral part of the resin top surface. Peripheral part 18a is chamfered. Formed at one corner of the resin top surface is a recess part having a diameter of from 0.2 mm to 0.3 mm. This recess part serves as polarity mark 18b. Each of bottom surfaces (0.15 mm×0.2 mm) of thick parts 11a–13a of first to third leads 11–13 is exposed at resin bottom surface 18c and projects by from 0.03 mm to 0.05 mm so as to meet lead stand-off specifications. Because such a projection length is less than the difference in thickness between thick parts 11a–13a and thin parts 11b–13b (i.e., 0.1 mm), the bottom surfaces of thin parts 11b–13b of first to third leads 11–13 are completely covered with resin 18. The exposed surfaces of first to third leads 11–13 are solderplated such that each of the exposed surfaces is covered with a film of solder the adequate thickness of which is 4–15 μm.

In accordance with electronic component 10 described above, at the time of performing a mounting process on a printed board, a corner part, which is defined between a lateral surface and a bottom surface of each of thick parts 11a–13a, is used for establishing connection with the outside. The corner parts are solderplated therefore providing good solderability during the mounting process. A space, taken up by electronic component 10 on the printed board, is equal to the area of resin bottom surface 18c, which makes it possible to provide higher mounting density on the printed board. Additionally, lead deformation is unlikely to occur.

Figure 5:
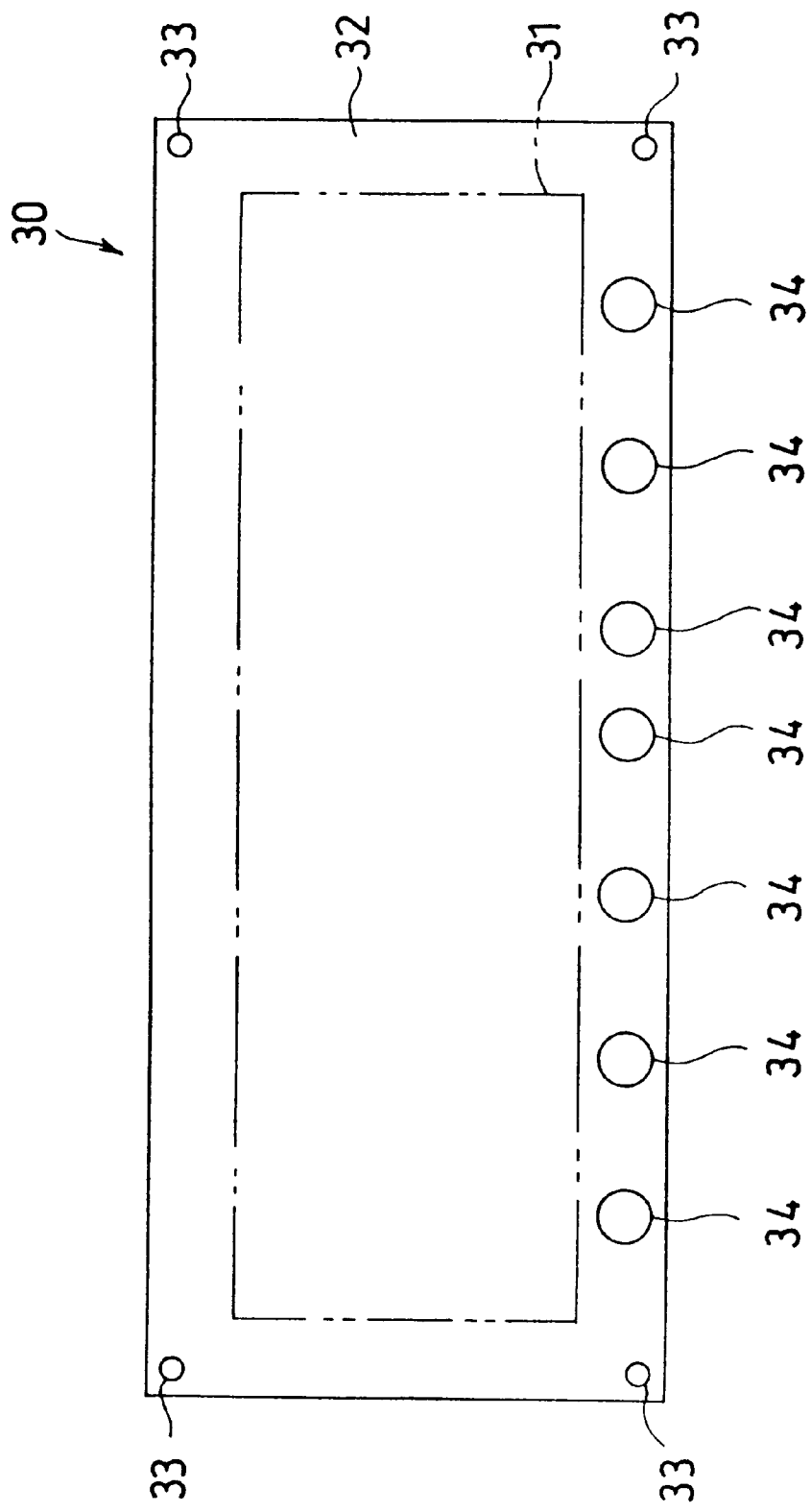
FIG. 5 is a plan view of a lead frame for use in the fabrication of the electronic component of FIG. 1.

FIGS. 5–8 respectively illustrate a lead frame for use in the fabrication of electronic component 10 in a plan view, in an enlarged view, in a cross sectional view taken along the line VII—VII, and in another cross sectional view taken along the line VIII—VIII. Lead frame 30 is formed by a metal plate having the form of a rectangular and is comprised of lead formation part 31 for exterior frame 32 for enclosing lead formation part 31. Exterior frame 32 is 20 mm×50 mm and is 0.2 mm thick. Referring to FIG. 5, exterior frame 32 has, at its corner parts, four portions defining respective holes 33 having a diameter of 1 mm for locating the lead frame 30. In addition to the provision of location holes 33, exterior frame 32 has seven portions along one of the long sides thereof, these seven portions defining seven feed holes 34 having a diameter of 2 mm.

Figure 6:
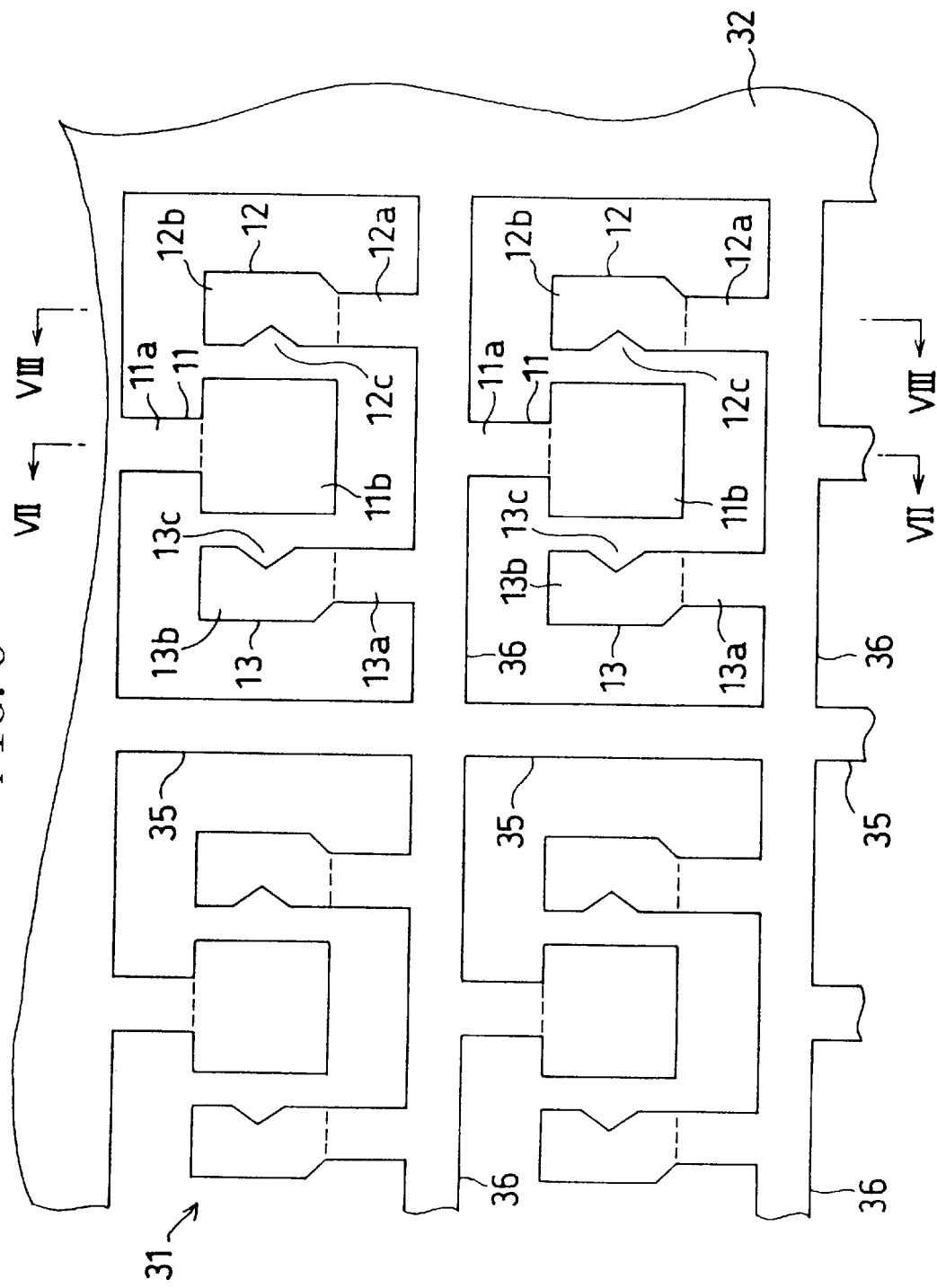
FIG. 6 is a detail, enlarged plan view of a lead formation part of FIG. 5.
Figure 7:
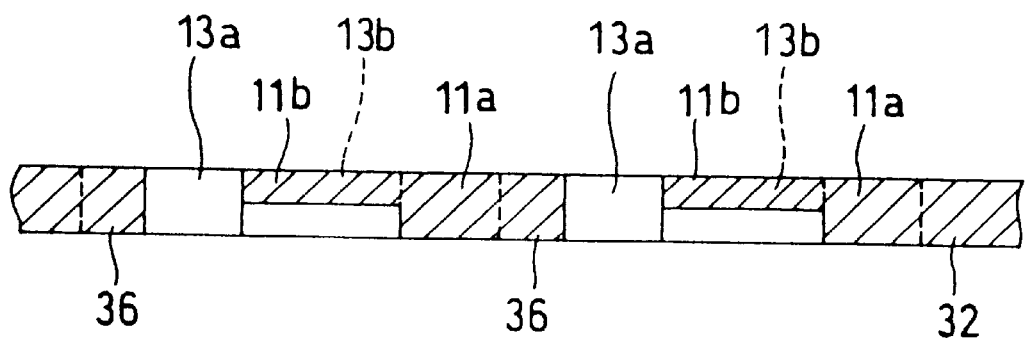
FIG. 7 is a cross sectional view of the lead formation part taken along the line VII—VII of FIG. 6.
Figure 8:
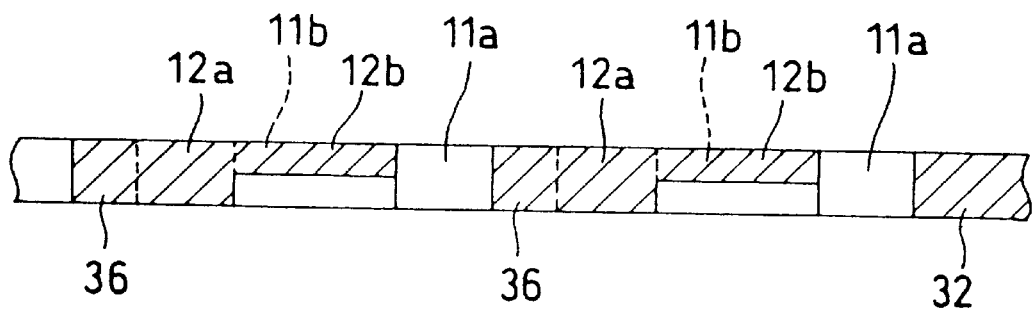
FIG. 8 is a cross sectional view of the lead formation part taken along the line VIII—VIII of FIG. 6.

As shown in detail in FIGS. 6–8, lead formation part 31 includes a vertical bridge part 35 and a lateral bridge part 36. Vertical bridge part 35 bridges opposite two long sides of exterior frame 32. Lateral bridge part 36 bridges the remaining opposite two short sides of exterior frame 32. Vertical and lateral bridge parts 35 and 36 each have a width of 0.2 mm and a thickness of 0.2 mm. These vertical and lateral bridge parts 35 and 36 define 220 lattice open spaces (11 columns×20 rows). The vertical pitch of the lattice spaces is 1.3 mm and the lateral pitch thereof is 2.1 mm. First to third lead parts 11–13 extend towards the lattice open spaces, in other words 220 sets of first to third lead parts 11–13 are two-dimensionally arranged at the foregoing pitches. These pitches are ½ to ⅓ of the conventional ones. First lead part 11 downwardly extends from exterior frame 32 and lateral bridge part 36 by 0.8 mm, while second and third lead parts 12 and 13 upwardly extend from exterior frame 32 and lateral bridge part 36 by 0.8 mm.

Each first lead part 11 has a base end 11a (length: 0.3 mm; width: 0.2 mm; thickness: 0.2 mm) and a leading end 11b (length: 0.5 mm; width: 0.5 mm; thickness: 0.1 mm). A step of 0.1 mm is provided on the bottom surface side of first lead part 11. Leading end 11b has a top surface (0.5 mm×0.5 mm) that is greater in width than base end's 11a top surface.

Each second lead part 12 has a base end 12a (length: 0.3 mm; width: 0.2 mm; thickness: 0.2 mm) and a leading end 12b (length: 0.5 mm; width: 0.3 mm; thickness: 0.1 mm). Likewise, each third lead 13 has a base end 13a (length: 0.3 mm; width: 0.2 mm; thickness: 0.2 mm) and a leading end 13b (length: 0.5 mm; width: 0.3 mm; thickness: 0.1 mm). A step of 0.1 mm is provided on the bottom surface side of second lead part 12, and a step of 0.1 mm is provided on the bottom surface side of third lead part 13. Leading end 12b has a wider top surface than base end 12a, and leading end 13b has a wider top surface than base end 13a. Leading ends 12b and 13b of second and third lead parts 12 and 13 have notches 12c and 13c having a depth of 0.08 mm.

It is possible to form the foregoing steps provided on the bottom surface sides of first to third lead parts 11–13 by coining, etching or pressing. The foregoing seven feed holes 34 are provided at positions corresponding to the second, fifth, eighth, eleventh, thirteenth, sixteenth and nineteenth columns from the left-hand side in the 11×22 lattice (see FIG. 5).

The foregoing lead frame structure allows 220 sets of lead parts 11–13 to be closely and two-dimensionally placed on a single lead frame 30. The number of electronic components 10 that a single lead frame 30 can yield is increased in comparison with conventional techniques, and metal material for forming lead frame 30 is used more efficiently.

The fabrication of the above-described electronic component 10, that is, the assembly process, comprises a die bonding process, a wire bonding process, a molding process, a dicing (cutting) process, and a lead finishing process. In the die bonding process, semiconductor chip 15 is fixed to leading end 11b of first lead part 11 of lead frame 30 using conductive adhesive 14. In the wire bonding process, two electrodes on semiconductor chip 15 are electrically connected with leading ends 12b and 13b of second and third lead parts 12 and 13 by fine Au wires 16 and 17. Both in the die bonding process and in the wire bonding process, feed holes 34, formed in exterior frame 32 of the lead frame, are used for mounting, on a single lead frame 30, 220 semiconductor chips 15. In the molding process, a mold assembly for transfer mold is used for integral encapsulation of most of first to third lead parts 11–13, semiconductor chips 15, and Au wires 16 and 17.

Figure 9:
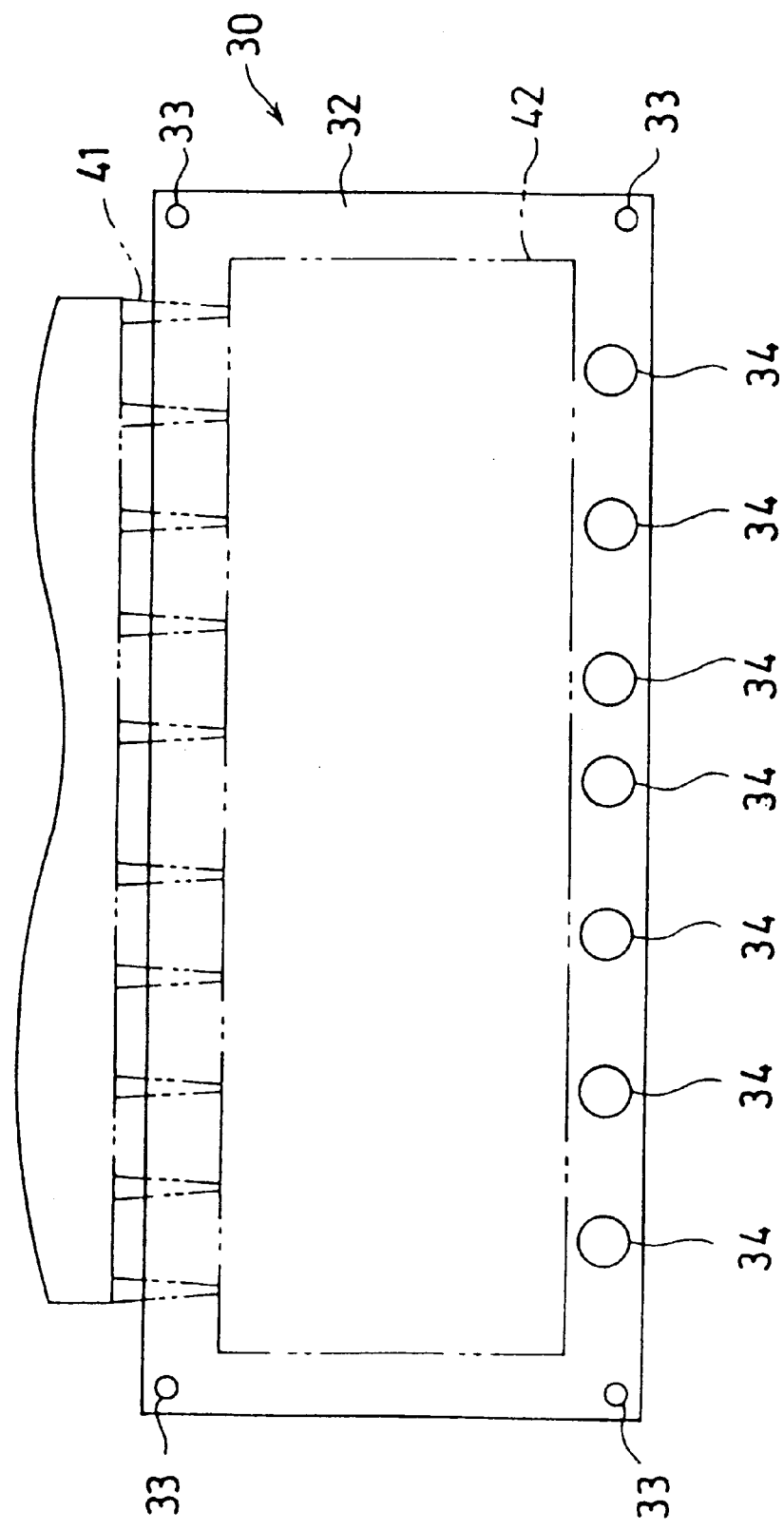
FIG. 9 is a plan view of the lead frame of FIG. 5 after a molding process is completed.
Figure 10:
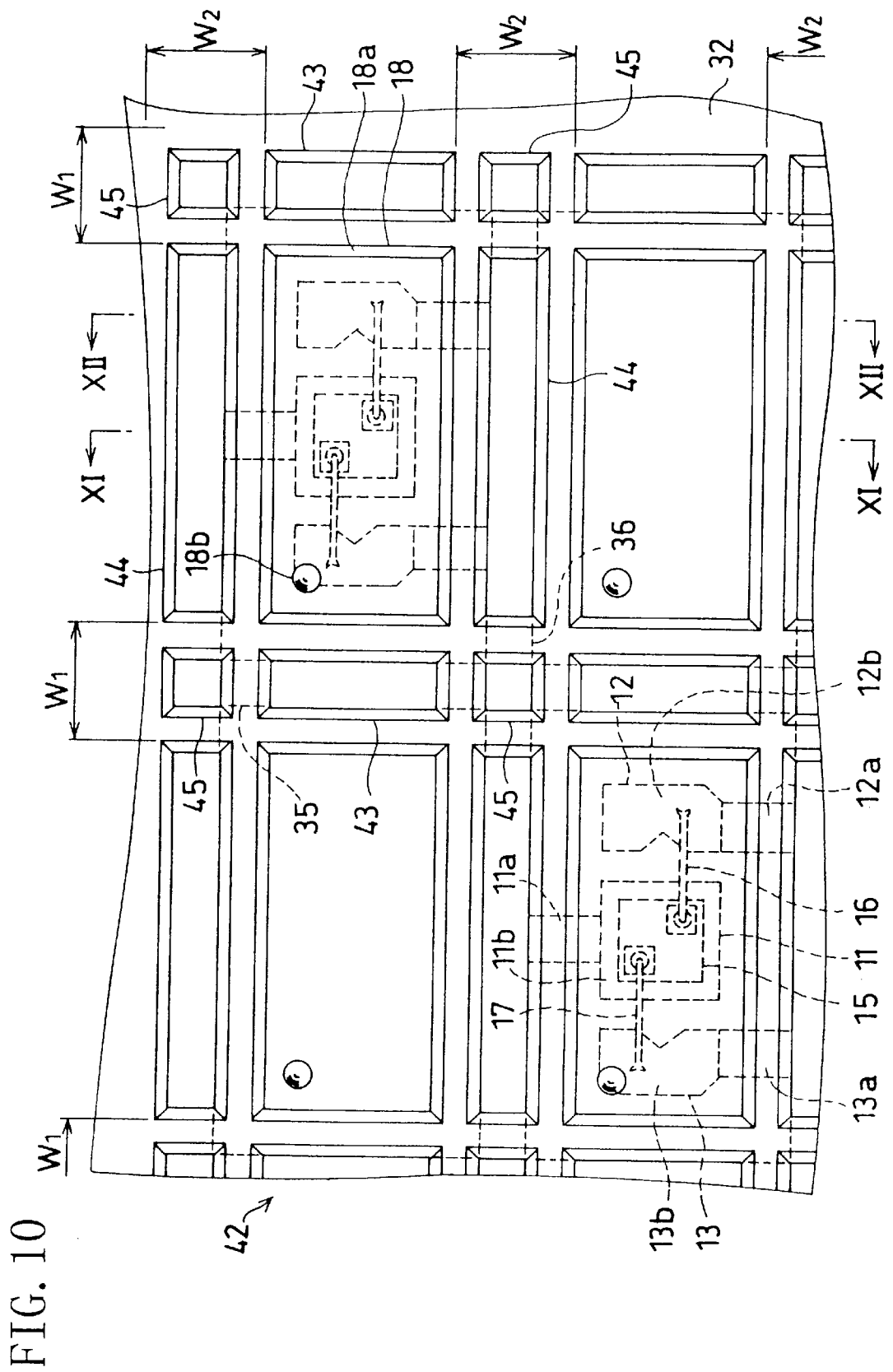
FIG. 10 is a detail, enlarged plan view of a mold part of FIG. 9.
Figure 11:
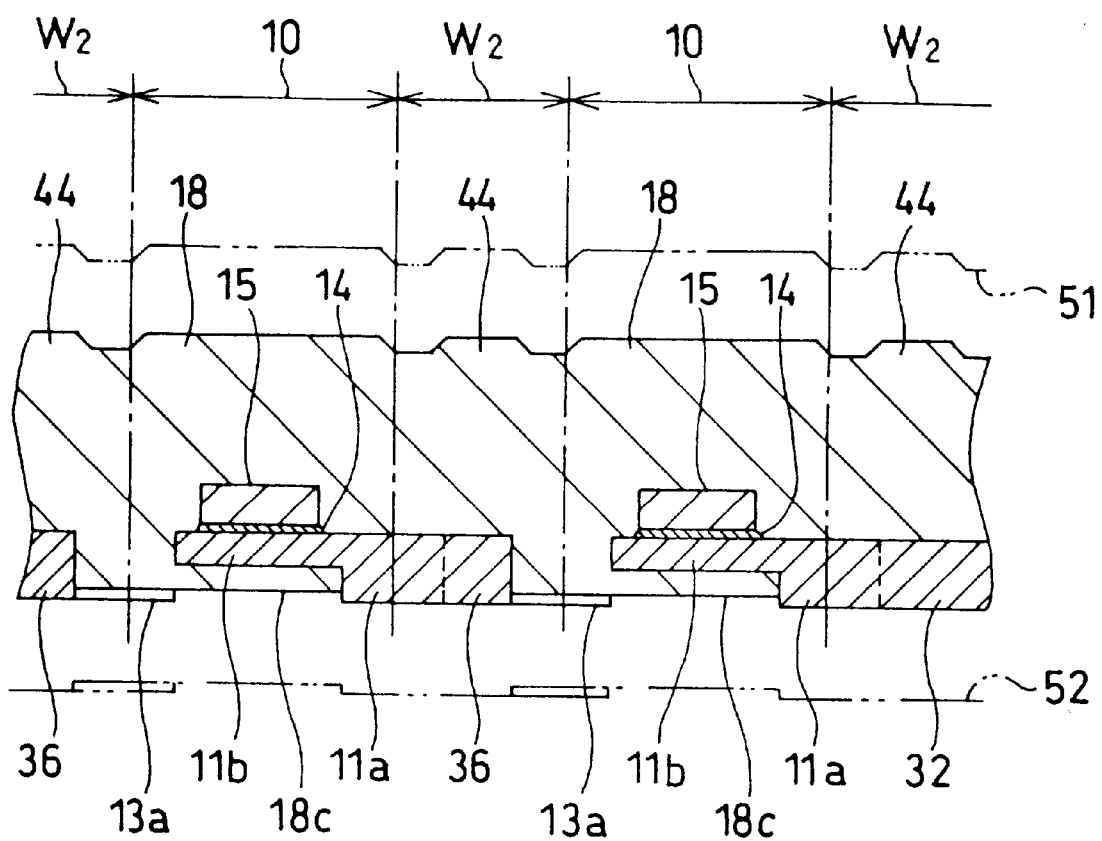
FIG. 11 is a cross sectional view of the mold part taken along the line XI—XI of FIG. 10.
Figure 12:
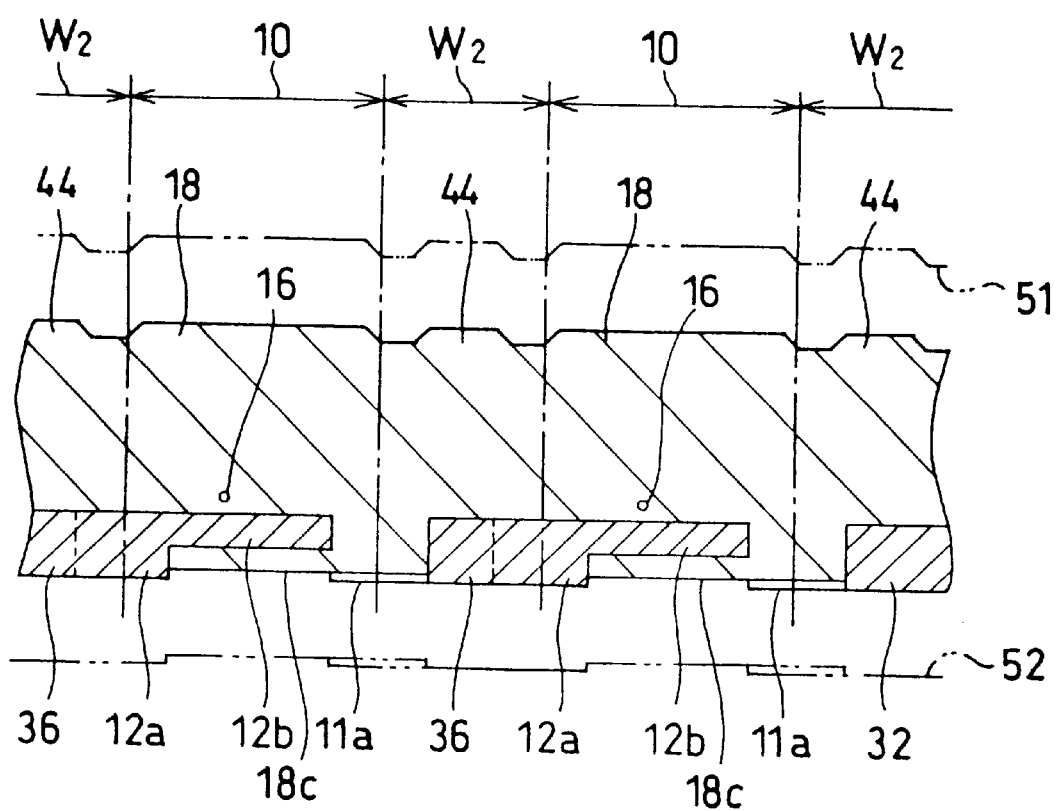
FIG. 12 is a cross sectional view of the mold part taken along the line XII—XII of FIG. 10.

FIGS. 9–12 are views of lead frame 30 after molding is completed. FIG. 9 is a plan view of the post-molding lead frame 30. FIG. 10 is an enlarged view of the post-molding lead frame 30. FIG. 11 is a cross sectional view of the post-molding lead frame 30 taken along the line XI—XI. FIG. 12 is another cross sectional view of the post-molding lead frame 30 taken along the line XII—XII. Referring first to FIG. 9, therein shown are ten common gates 41 for resin introduction, and a mold part 42 defined by an upper mold element and a lower mold element. These ten common gates 41 are provided at positions corresponding to the first, third, fifth, seventh, ninth, twelfth, fourteenth, sixteenth, eighteenth and twentieth columns from the left-hand side of the foregoing lattice structure of lead frame 30 (11 columns×20 rows).

As shown in detail in FIGS. 10–12, at the same time that a resin 18, which has encapsulated most of lead parts 11–13, semiconductor chips 15, and Au wires 16–17, is formed in each of the lattice open spaces, additional resins 43–45 are formed overlying vertical bridge part 35 and lateral bridge part 36. Additional resins 43–45 have the same height as resin 18. Each resin 18 is horizontally and perpendicularly coupled one another via additional resins 43–45. Peripheral part 18a is chamfered and polarity mark 18b is formed at one corner of the top surface, having a diameter of from 0.2 mm to 0.3 mm. Additional resin 43, which is formed as a ridge on vertical bridge part 35, is chamfered at its periphery, and the width of additional resin's 43 top surface is equal to the width of vertical bridge part 35 (i.e., 0.2 mm). In other words, two grooves, which are greater in width at top than at bottom, are formed between two adjacent molding resins 18 facing each other across additional resin 43, along vertical bridge part 35. Likewise, additional resin 44, which is formed as a ridge on lateral bridge part 36, is chamfered at its periphery, and the width of additional resin's 44 top surface is equal to the width of lateral bridge part 36 (0.2 mm). In other words, two grooves, which are greater in width at top than at bottom, are formed between two adjacent molding resins 18 facing each other across additional resin 44, along lateral bridge part 36. Additional resin 45, which is formed overlying a point where vertical bridge part 35 and lateral bridge part 36 cross, is chamfered at its periphery and has a top surface of 0.2 mm×0.2 mm. FIGS. 10–12 show examples in which a series of additional resins 43–45 is formed also on exterior frame 32 of the lead frame.

FIGS. 11 and 12 show upper mold element 51 and lower mold element 52 for use in a molding process. Lead frame 30 having thereon 220 semiconductor chips 15 which are horizontally and perpendicularly, and two-dimensionally arranged, is placed on lower mold element 52. Lower mold element 52 has a forming surface that is provided with a great number of recess parts, thereby allowing the bottom surfaces (0.3 mm×0.2 mm) of base ends 11a–13a of first to third lead parts 11–13, exterior frame 32, vertical bridge part 35, and lateral bridge part 36 to project from resin bottom surface 18c by 0.03 mm to 0.05 mm. Defined between upper mold element 51 and lower mold element 52 are 220 cavities for the formation of molding resin 18 which are arranged horizontally and perpendicularly, and two-dimensionally, and open spaces for the formation of additional resins 43–45 which have the same height as the cavities. These 220 cavities are horizontally and perpendicularly coupled one another through the open spaces. Upper mold element 51 has a forming surface in which many recess parts having a depth capable of defining most of the cavities and most of the communication open spaces for the cavities are formed. The cavities and the communication open spaces of the cavities are easily filled with a resin that is injected from a common runner through the foregoing ten common gates 41. The angle and dimensions of each common gate 41 are 30 degrees and 0.4 mm×0.2 mm. Additionally, at least one of upper and lower mold elements 51 and 52 is provided with pins (not shown in the figure) which are inserted into location holes 33 formed in exterior frame 32 of the lead frame. Such an arrangement prevents lead frame 30 from making a displacement with respect to the mold assembly.

In accordance with the above-described mold assembly structure, the 220 semiconductor chips 15 and the 220 sets of first to third lead parts 11–13 are integrally encapsulated by resin. Accordingly, the number of electronic components 10 that a single molding process can yield increases in comparison with conventional fabrication techniques, thereby providing improved productivity. Additionally, most of the appearance of molding resin 18 can be changed freely by replacement of upper mold element 51.

In the dicing process, lead frame 30 is cut together with resins 18, 43, 44, and 45 with a single cutting blade having a width of 0.5 mm in order that resin cut surfaces and lead cut surfaces are formed at the same time at package lateral surfaces of two electronic components 10 corresponding to two adjacent semiconductor chips 15. The cutting blade width is greater, by 0.3 mm, than the width of vertical and lateral bridge parts 35 and 36 of the lead frame (0.2 mm). W1 and W2 of FIGS. 10–12 each indicate a cutting width of 0.5 mm. Location hole 33, formed in exterior frame 32 of the lead frame, is used for identification of a cutting position. The top surfaces of additional resins 43–45 having a width of 0.2 mm are located at the centers of W1 and W2, and grooves, horizontally and perpendicularly formed by chamfer, guide a blade for dicing in a travelling direction. As a result, individual electronic components 10, each of which having a rectangular parallelepiped-like resin 18 whose bottom surface dimensions are 1.6 mm×0.8 mm and first to third leads 11–13 having a length of 0.65 mm, are separated. At this time, in lead frame 30, base portions having a length of 0.15 mm of base ends 11a–13a of each lead part, are discarded. As a result, a cut surface of first lead 11, which has dimensions of 0.2 mm×0.2 mm, is exposed at a lower end area of one lateral surface of resin 18, being flush with the lateral surface of resin 18. In addition, cut surfaces of second and third leads 12 and 13 (0.2 mm×0.2 mm) are exposed at lower end areas of opposite lateral surface of resin 18, being flush with the opposite lateral surface of resin 18. Further, formed on a package bottom surface are projecting surfaces (0.15 mm×0.2 mm) of first to third leads 11–13. As described above, use of a soft material which cuts easily for forming lead frame 30 including first to third lead parts 11–13 reduces wear of a cutting blade for dicing, as a result of which variations in cutting width and reductions in cutting rate are suppressed.

In the lead finishing process, the exposed surfaces of first to third leads 11–13 are solderplated such that the exposed surfaces are covered with a film of solder having a thickness of 4–15 $\mu$m. As a result, solder in the form of film is applied onto each cut surface (0.2 mm×0.2 mm) of first to third leads 11–13 formed on the package lateral surface and onto each projecting surface (0.15 mm×0.20 mm) of first to third leads 11–13 formed on the package bottom surface. Other plating may be employed instead of solderplating. In addition, solderplating may be eliminated depending on the material of lead frame 30.

In accordance with the fabrication method of electronic component 10, resin and lead cut surfaces are formed at the same time on a package lateral surface, which makes it possible to eliminate the need for performing a deburring process. In addition, unlike conventional techniques, it is unnecessary to perform a forming process for providing a bent in an elongated lead, which provides an improved yield.

Figure 13:
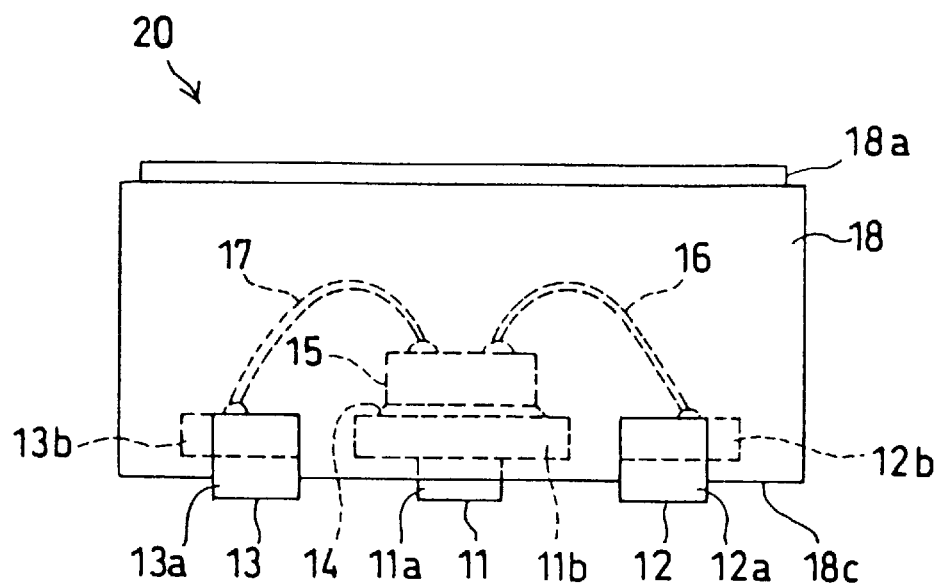
FIG. 13 is a front view of another electronic component in accordance with the present invention.
Figure 14:
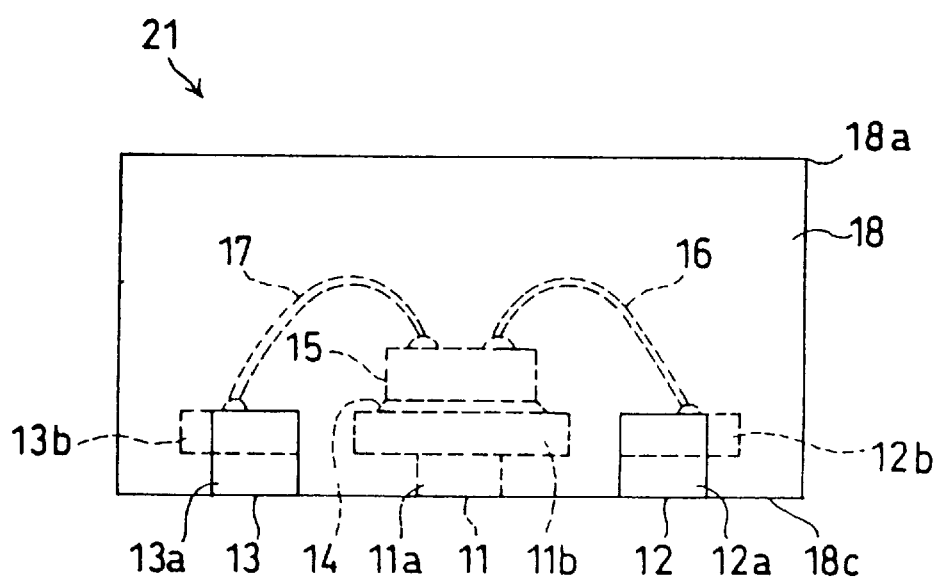
FIG. 14 is a front view of still another electronic component in accordance with the present invention.

FIGS. 13 and 14 illustrate the appearances of other surface mount type electronic components in accordance with the present invention. Referring to FIG. 13, an electronic component 20 is shown in which, instead of a chamfer, a step is provided at peripheral part 18a of the resin top surface. As in the above-described case, the appearance of resin 18 can be changed freely by replacement of upper mold element 51. Referring now to FIG. 14, an electronic component 21 is illustrated in which resin 18 has the form of a perfect rectangular parallelepiped and the bottom surfaces of thick parts 11a–13a and resin bottom surface 18c are exposed forming the same plane. In this case, lower mold element 52 may have a flat forming surface. Even with the FIG. 14 structure, lead stand-off specifications can be met by subjecting the exposed surfaces of first to third leads 11–13 to solderplating for formation of solder films thereon having a thickness of 4–15 $\mu$m. In accordance with electronic component 10 of FIGS. 1–4 or in accordance with electronic component 20 of FIG. 13, a chamfer or a step is provided at peripheral part 18a of the resin top surface, which provides the advantage that, when cutting resin 18, the thickness of resin to be cut is thin in comparison with the case of electronic component 21 of FIG. 14.

Figure 15:
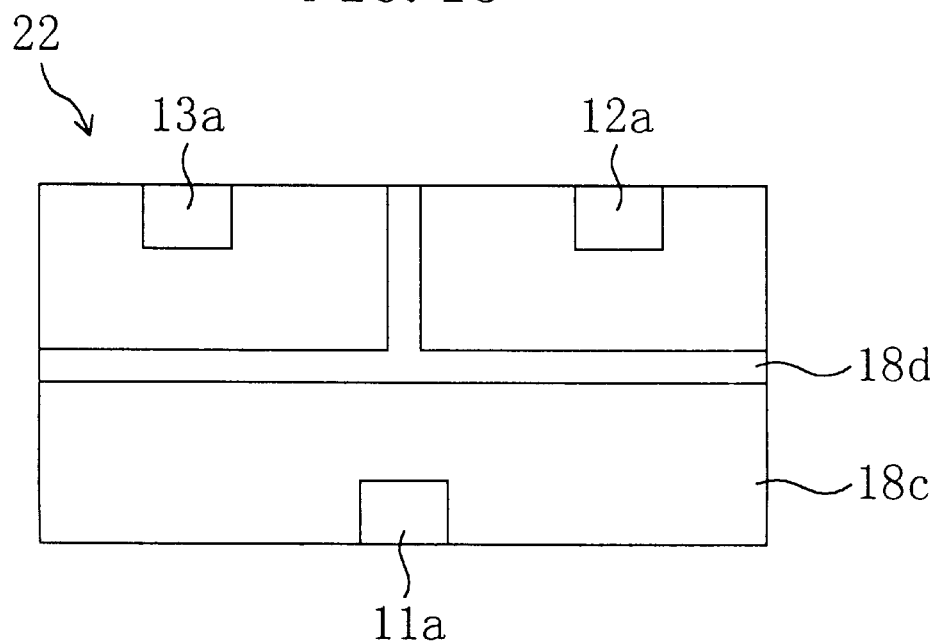
FIG. 15 is a bottom view of another electronic component in accordance with the present invention.
Figure 16:
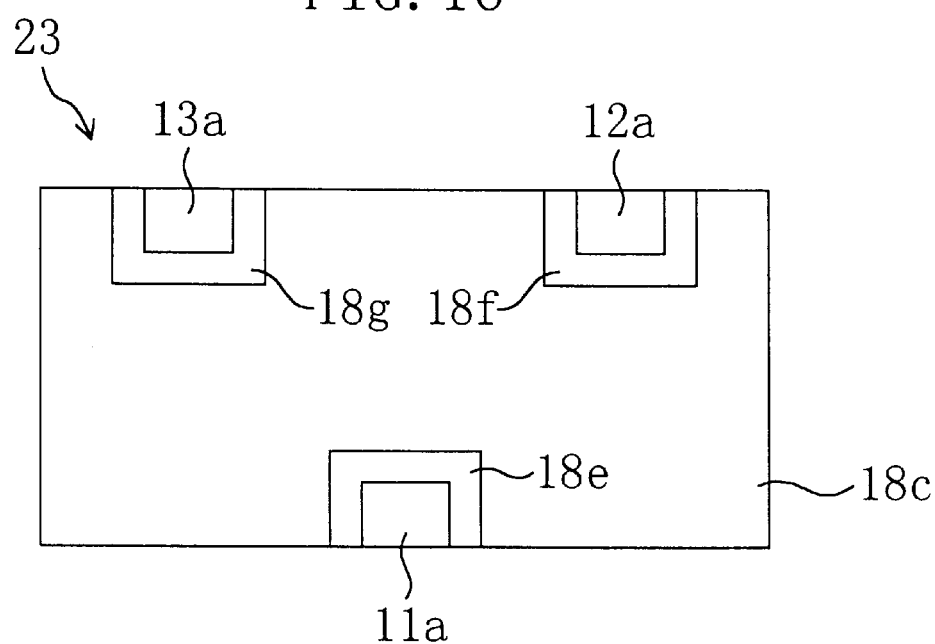
FIG. 16 is a bottom view of still another electronic component in accordance with the present invention.

In electronic component 21 of FIG. 14, lead thick parts 11a–13a have bottom surfaces which are exposed being flush with resin bottom surface 18c. In such a case, there is the possibility that resin, which has been injected in the molding process, enter between the flat forming surface of the lower mold element and the bottom surfaces of lead thick parts 11a–13a, particularly at the center of the lead frame. FIGS. 15 and 16 show solutions to this problem. FIG. 15 shows electronic component 22 in which T-shaped groove 18d is formed in resin bottom surface 18c. FIG. 16 shows electronic component 23 in which three U-shaped grooves 18e–g are formed in resin bottom surface 18c. These three U-shaped grooves 18e–g are formed in such a way as to enclose lead thick parts 11a–13a, respectively. As a result of such arrangement, the foregoing entering of resin can be prevented because ridges of the lower mold element corresponding to grooves 18d–g achieve a reduction in resin pressure.

Figure 17:
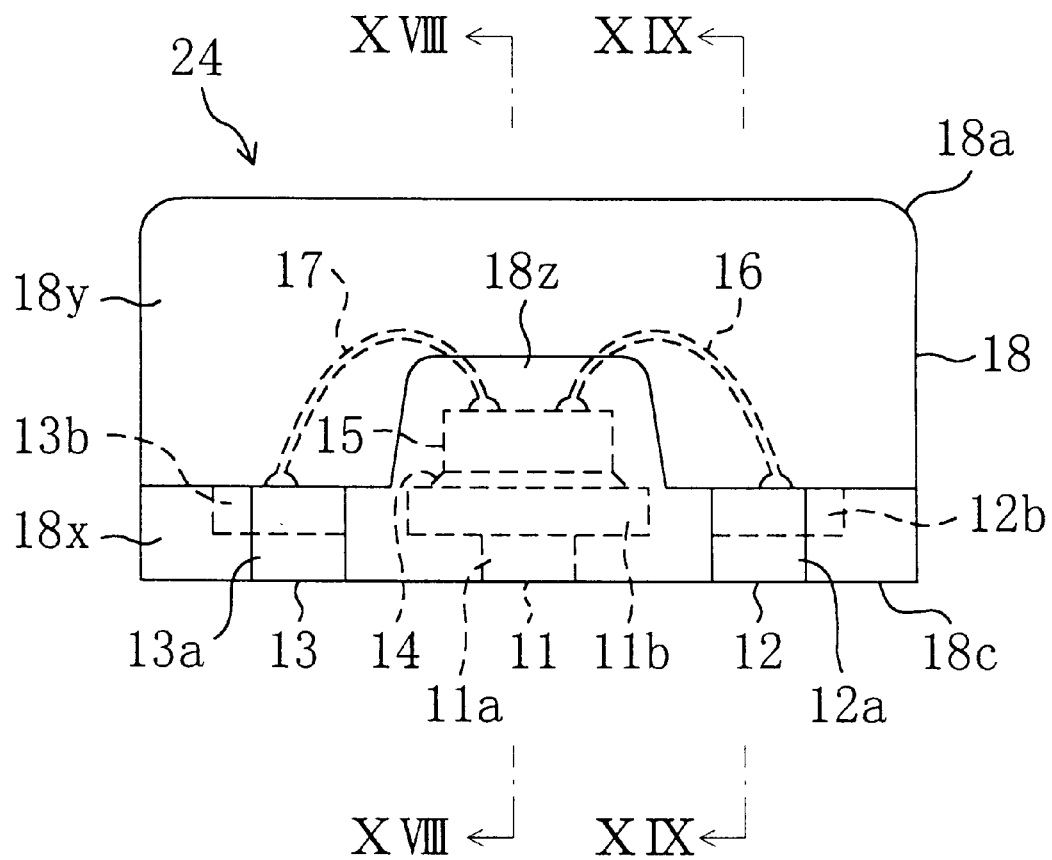
FIG. 17 is a front view of another electronic component in accordance with the present invention.
Figure 18:
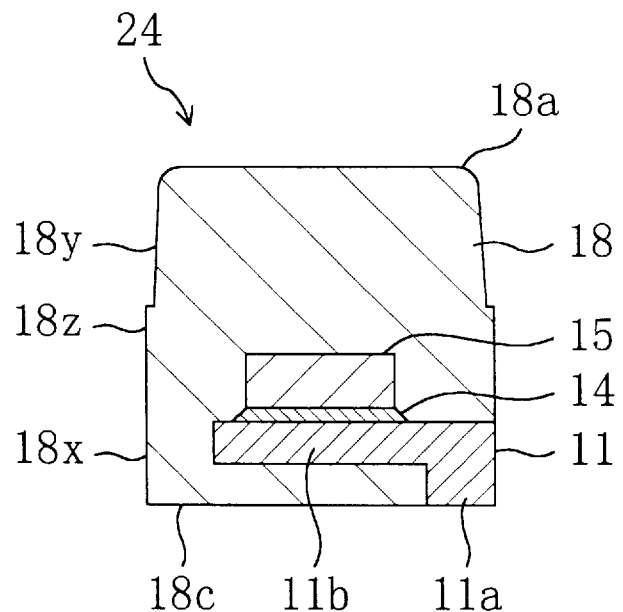
FIG. 18 is a cross sectional view of the electronic component taken along the line XVIII—XVIII of FIG. 17.
Figure 19:
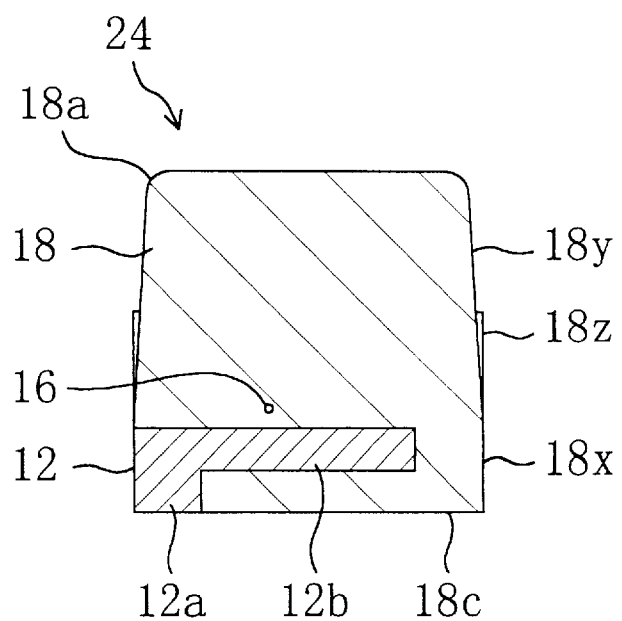
FIG. 19 is a cross sectional view of the electronic component taken along the line XIX—XIX of FIG. 17.

With reference to FIGS. 17–19, the appearance and internal structure of another surface mount type electronic component in accordance with the present invention is shown. FIG. 17 is a plan view of the electronic component. FIG. 18 is a cross sectional view of the electronic component taken along the line XVIII—XVIII of FIG. 17. FIG. 19 is a cross sectional view of the electronic component taken along the line XIX—XIX of FIG. 17. In electronic component 24 of FIGS. 17–19, peripheral part 18a of the resin top surface is chamfered and lead thick parts 11a–13a have bottom surfaces which are exposed being flush with resin bottom surface 18c. Electric component 24 has a resin lateral surface which is composed of a cut surface 18x that is formed at a lower end area of the resin lateral surface simultaneously with a lead cut surface by dicing, and a non-cut surface 18y formed by molding. Cut surface 18x of the resin lateral surface is perpendicular to resin bottom surface 18c, and a part of cut surface 18x forms common gate cut surface 18z. This common gate cut surface 18z is located between the cut lateral surfaces of second and third lead thick parts 12a and 13a. Non-cut surface 18y of the resin lateral surface is inclined by an angle of three degrees with respect to resin bottom surface 18c so that molding resin 18 can be withdrawn easily from the mold assembly. The exposed surfaces of first to third leads 11–13 are solderplated. Lead frame 30, shown in FIGS. 5–8, may be used in the fabrication of electronic component 24.

Figure 20:
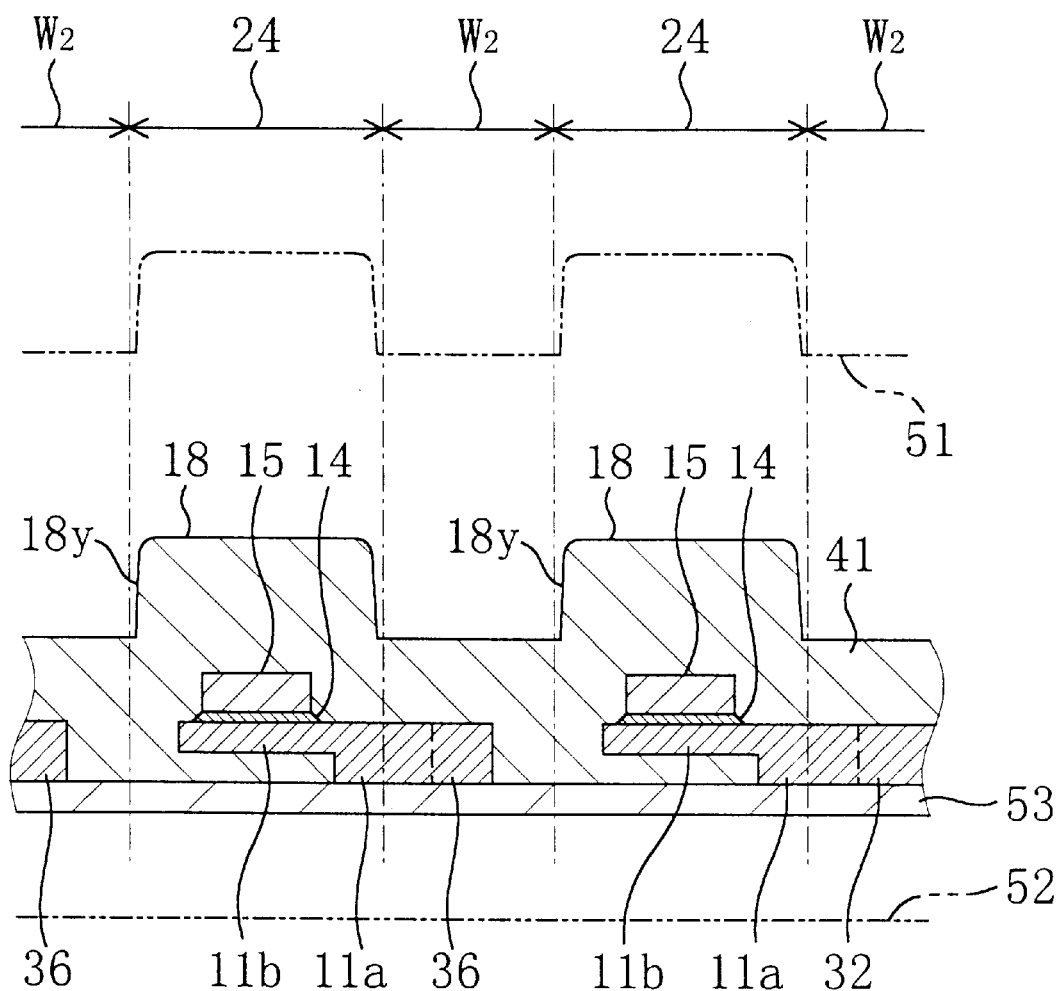
FIG. 20 is a cross sectional view of the electronic component of FIG. 17 corresponding to FIG. 11.
Figure 21:
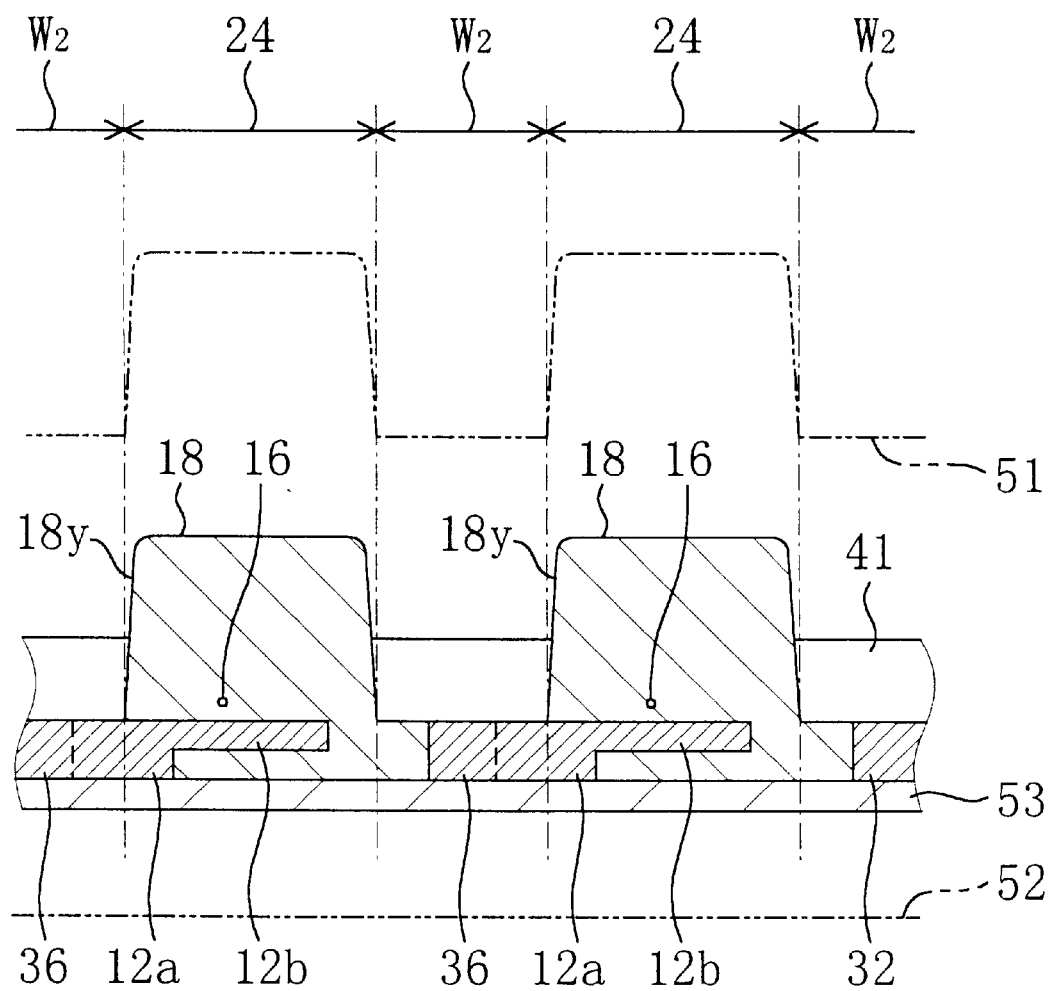
FIG. 21 is a cross sectional view of the electronic component of FIG. 17 corresponding to FIG. 12.
Figure 22:
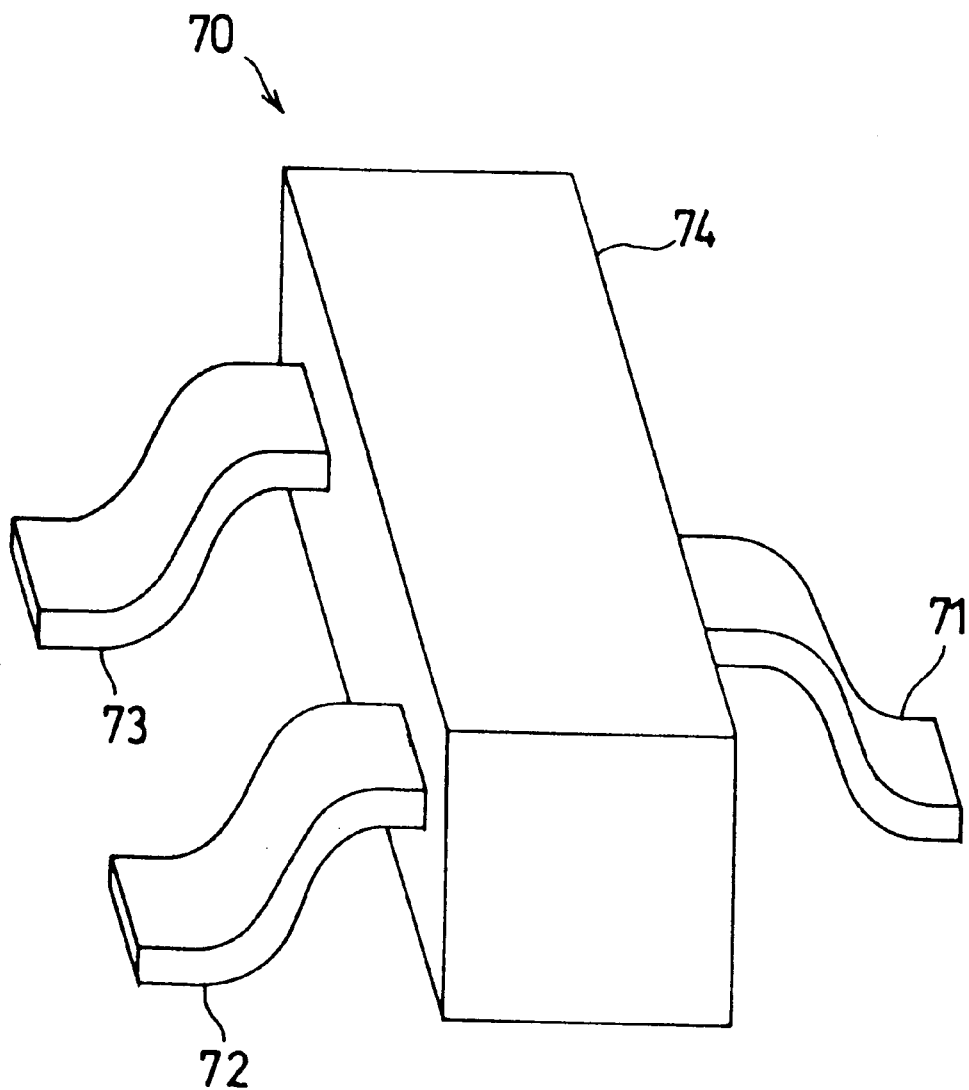
FIG. 22 is a perspective view of a conventional electronic component.
Figure 23:
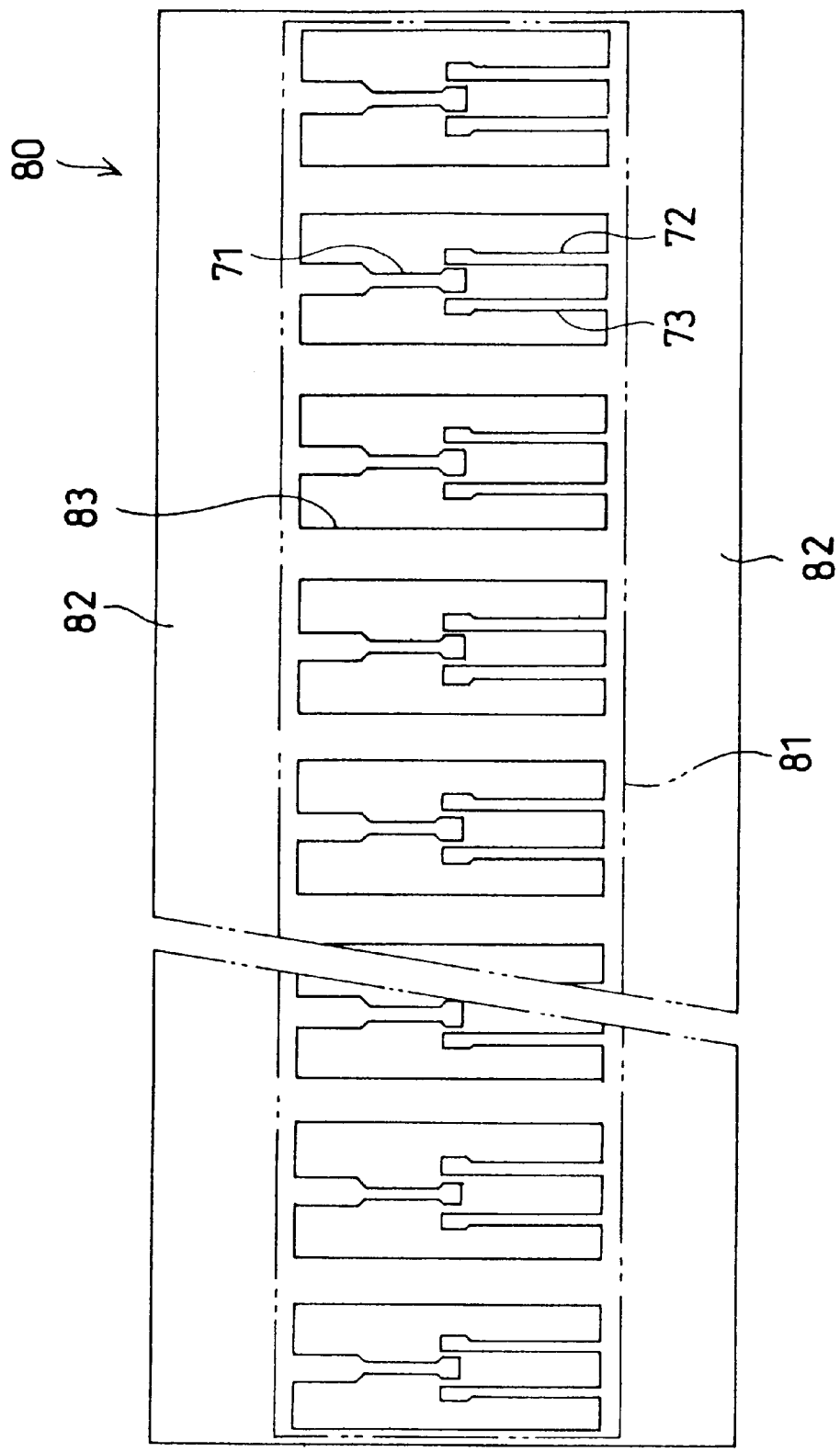
FIG. 23 is a plan view of a conventional lead frame.
Figure 24:
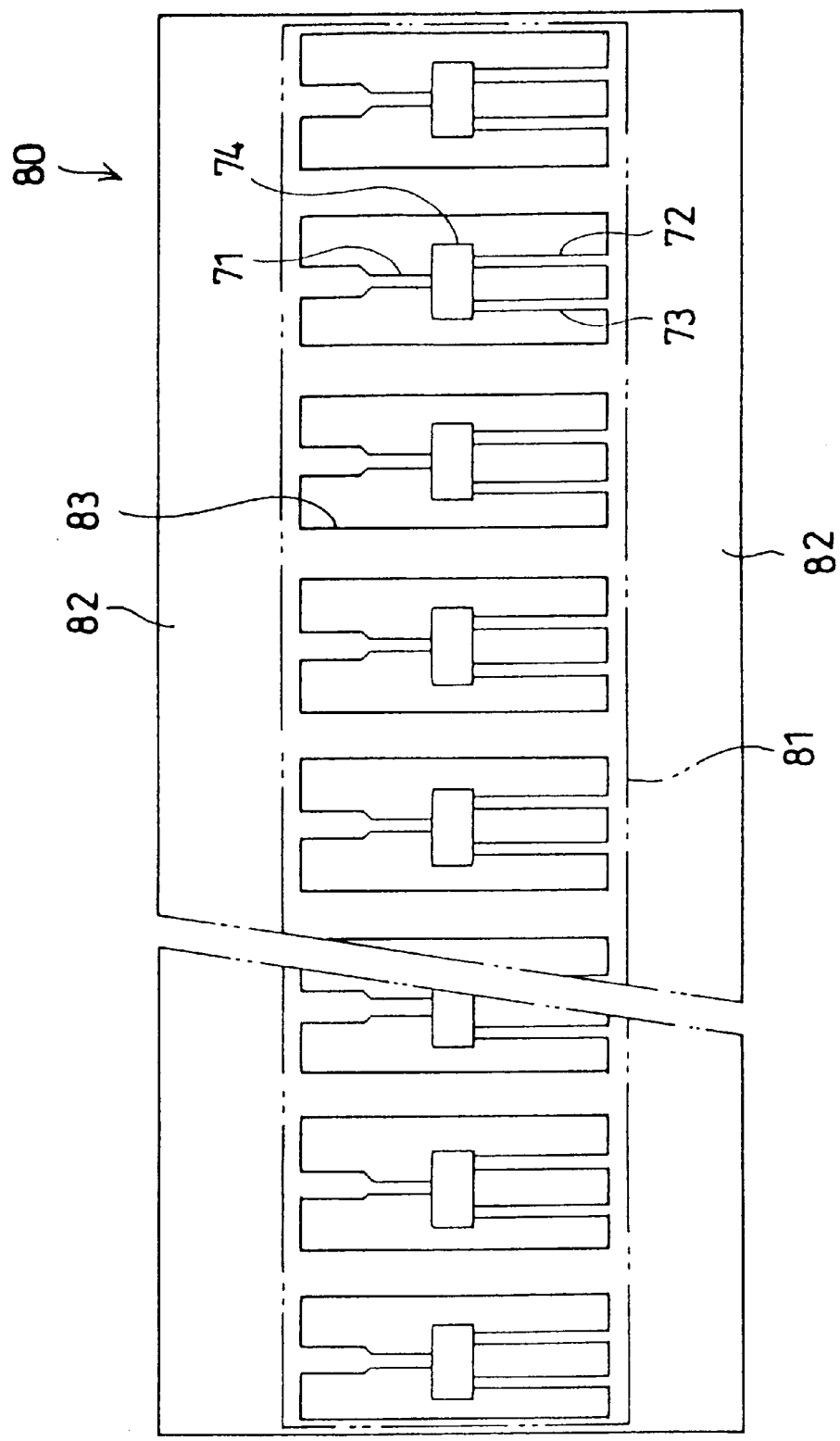
FIG. 24 is a plan view of the lead frame of FIG. 23 after a molding process is completed.

FIGS. 20 and 21, which correspond to FIGS. 11 and 12, shows situations after molding for electronic component 24 is completed. In FIGS. 20 and 21, 51 is an upper mold element. 52 is a lower mold element. 41 is a common gate for resin injection. Defined between upper mold element 51 and lower mold element 52 are 220 cavities which are horizontally and perpendicularly, and two-dimensionally arranged for the formation of molding resins 18. Note that these cavities are communicated with one another through common gates 41 only in the column direction. Common gates 41 are located at positions corresponding to each column of the 11×22 cavities. Lower mold element 52 has a flat forming surface, and, accordingly, elastic sheet 53 is inserted between lower mold element 52 and the lead frame, to prevent the entering of injected resin and to protect the lead bottom surface. In such a case, base ends 12a and 13a of second and third lead parts 12 and 13 of each electronic component are pressed by upper mold element 51 at positions away from the common gate 41. It is possible to prevent the entering of injected resin without elastic sheet 53, depending on the resin pressure.

In accordance with electronic component 24, a cut surface of first lead 11 is exposed at a lower end area of a lateral surface of resin 18, being flush with resin cut surface 18x, and cut surfaces of second and third leads 12 and 13 are exposed at lower end areas of opposite lateral surface of resin 18, being flush with resin cut surface 18x. In addition, molding is performed such that each of the bottom surfaces of first to third leads 11–13 is exposed being flush with resin bottom surface 18c. Further, the exposed cut surfaces and exposed bottom surfaces of first to third leads 11–13 are continuous, and here are formed lead corner parts for connections with the outside. Accordingly, electronic component 24 is a super small component most suitable for surface mount technology.

In each of the aforesaid examples, electric connection between semiconductor chip (electronic element) 15 and second and third leads 12 and 13 may be established by means other than Au wires 16 and 17. Instead of using plate-like lead frame 30, an alternative, which is formed by patterning the like lead frame in an insulating substrate, may be used. In each example, only the exposed bottom surfaces of first to third leads 11–13 may be subjected to solderplating.

The number of leads is not limited to the above-described number. Instead of semiconductor chip 15, any electronic elements may be incorporated into electronic components 10, 20, 21, 22, 23, and 24.

The invention claimed is:

1. An electronic component of a resin molded package type, said electronic component comprising:

(a) an electronic element;

(b) a lead which is electrically connected with said electronic element, said lead having a thin part and having a thick part which is formed to provide a step on a bottom surface of said lead; and (c) a resin which encapsulates said electronic element and said lead;

wherein a lateral surface of said thick part is exposed at a lower end area of a lateral surface of said resin.

2. The electronic component of claim 1, wherein said lead is formed of a soft material which cuts easily.

3. The electronic component of claim 1, wherein said exposed lateral surface of said thick part is plated.

4. The electronic component of claim 1, wherein a bottom surface of said thick part is exposed at a bottom surface of said resin.

5. The electronic component of claim 4, wherein plating is applied only to said exposed bottom surface of said thick part.

6. The electronic component of claim 4, wherein said exposed bottom surface of said thick part is continuous with said exposed lateral surface of said thick part.

7. The electronic component of claim 6, wherein said exposed bottom surface and exposed lateral surface of said thick part are plated.

8. The electronic component of claim 4, wherein said exposed bottom surface of said thick part slightly projects from said bottom surface of said resin.

9. The electronic component of claim 4, wherein said bottom surface of said resin has, around said exposed bottom surface of said thick part, portions defining grooves.

10. The electronic component of claim 1, wherein said resin has a top surface the periphery of which is provided with either a chamfer or a step.

11. The electronic component of claim 1, wherein at least a portion of each of four lateral surfaces of said resin is formed by cutting.

12. The electronic component of claim 1, wherein said lateral surface of said resin has a cut surface formed at the time of cutting said lead and a non-cut surface formed at the time of performing said encapsulation process.

13. The electronic component of claim 12, wherein said cut surface of said resin's lateral surface is perpendicular to said resin's bottom surface and wherein said non-cut surface of said resin's lateral surface tilts with respect to said resin's bottom surface.

14. The electronic component of claim 12, wherein said cut surface of said resin's lateral surface is formed, being perpendicular with respect to said resin's bottom surface at a lower end area of said resin's lateral surface.

15. The electronic component of claim 12, wherein each of lower end areas of four lateral surfaces of said resin is formed by cutting, being perpendicular with respect to said bottom surface of said resin.

16. The electronic component of claim 4, wherein said exposed bottom surface of said thick part projects, from said bottom surface of said resin, by a length less than a difference in thickness between said thin part and said thick part.

17. The electronic component of claim 1, wherein said thin part is greater in top surface width than said thick part.

18. The electronic component of claim 1, wherein said thin part has a top surface whose area is greater than the area of said electronic element and wherein said electronic element is fixed onto said thin part.

19. The electronic component of claim 1, wherein said thin part is provided with a notch, said notch acting as a prevention means for preventing said lead from slipping from said resin.

20. A plate-like lead frame for use in fabrication of an electronic component of a resin molded package type, said lead frame comprising:

(a) a rectangular exterior frame;

(b) a plurality of bridge parts which are formed into a lattice so as to establish connections between a pair of opposite sides of said rectangular exterior frame as well as between another pair of opposite sides thereof; and (c) a plurality of sets of lead parts which extend towards respective lattice open spaces which are horizontally and perpendicularly, and two-dimensionally defined by said bridge parts.

21. The lead frame of claim 20, each said lead part comprising:

(a) a base end having the same thickness as said exterior frame and said bridge part; and (b) a leading end which is formed, having a width greater than the width of said base end and having a thickness smaller than the thickness of said base end so as to form a step on the side of a bottom surface thereof.

22. The lead frame of claim 21, wherein a specific lead part of said plurality of sets of lead parts is provided with a leading end whose top surface area is greater than the area of an electronic element that is fixed thereon.

23. The lead frame of claim 21, wherein a specific lead part of said plurality of sets of lead parts is provided with a notch that is a prevention against lead slipping from a resin after a resin molding is performed.

24. The lead frame of claim 20, wherein said rectangular exterior frame has at four corners thereof portions defining holes for positioning which are used in performing a resin molding process as well as in cutting said plurality of sets of lead parts.

25. The lead frame of claim 20, wherein said rectangular exterior frame has at one side thereof portions defining a plurality of feed holes.

26. A mold assembly for use in fabrication of an electronic component of a resin molded package type, said mold assembly comprising:

(a) a lower mold element onto which a lead frame with a plurality of electronic elements which are arranged horizontally and perpendicularly, and two-dimensionally is placed;

(b) an upper mold element that defines a plurality of cavities which are horizontally and perpendicularly, and two-dimensionally arranged correspondingly to said plurality of electronic elements and which are communicated with one another at least in one direction; and (c) common gates through which a resin is injected into said plurality of cavities.

27. The mold assembly of claim 26, wherein said plurality of cavities are communicated with one another via open spaces having the same height as said cavities.

28. The mold assembly of claim 26, wherein said upper mold element is provided with a plurality of recesses, each of said recesses having a depth capable of forming most of each said cavity.

29. The mold assembly of claim 26, wherein at least one of said upper and lower mold elements is provided with pins which are inserted into holes for positioning formed in an exterior frame of said lead frame.

* * * * *